United States Patent
Palm et al.

(10) Patent No.: US 10,601,314 B2
(45) Date of Patent: Mar. 24, 2020

(54) POWER SEMICONDUCTOR SYSTEMS HAVING INDUCTOR MODULES, AND METHODS OF MANUFACTURING INDUCTOR MODULES AND POWER SEMICONDUCTOR SYSTEMS HAVING INDUCTOR MODULES

(71) Applicant: Infineon Technologies Austria AG, Villach (AT)

(72) Inventors: Petteri Palm, Regensburg (DE); Frank Daeche, Unterhaching (DE); Zeeshan Umar, Munich (DE); Andrew Sawle, Copthorne (GB); Maciej Wojnowski, Munich (DE); Xaver Schloegel, Sachsenkam (DE); Josef Hoeglauer, Heimstetten (DE)

(73) Assignee: Infineon Technologies Austria AG, Villach (AT)

( * ) Notice: Subject to any disclaimer, the term of this patent is extended or adjusted under 35 U.S.C. 154(b) by 18 days.

(21) Appl. No.: 15/699,740

(22) Filed: Sep. 8, 2017

(65) Prior Publication Data
US 2019/0081562 A1    Mar. 14, 2019

(51) Int. Cl.
| | |
|---|---|
| H02M 3/155 | (2006.01) |
| H01F 41/04 | (2006.01) |
| H01F 17/06 | (2006.01) |
| H02M 3/158 | (2006.01) |
| H01F 17/00 | (2006.01) |
| H01F 27/255 | (2006.01) |
| H02M 1/00 | (2006.01) |
| H01F 27/06 | (2006.01) |

(52) U.S. Cl.
CPC ........ *H02M 3/155* (2013.01); *H01F 17/0033* (2013.01); *H01F 17/062* (2013.01); *H01F 27/255* (2013.01); *H01F 41/046* (2013.01); *H02M 3/158* (2013.01); *H01F 2027/065* (2013.01); *H02M 2001/0048* (2013.01); *H02M 2001/0054* (2013.01)

(58) Field of Classification Search
USPC ........................................................ 361/748
See application file for complete search history.

(56) References Cited

U.S. PATENT DOCUMENTS

2008/0309442 A1 * 12/2008 Hebert .................. H01F 27/292
                                                        336/65
2009/0167477 A1    7/2009 Feng et al.
(Continued)

FOREIGN PATENT DOCUMENTS

DE    102016105096 A1    9/2017

*Primary Examiner* — Andargie M Aychillhum
(74) *Attorney, Agent, or Firm* — Murphy, Bilak & Homiller, PLLC

(57) ABSTRACT

A power semiconductor system includes a power stage module having one or more power transistor dies attached to or embedded in a first printed circuit board, and an inductor module attached to the power stage module and having an inductor electrically connected to an output node of the power stage module. The inductor is formed from a ferrite sheet embedded in a second printed circuit board and windings patterned into the second printed circuit board. Corresponding methods of manufacturing the power semiconductor system and the inductor module are also disclosed.

13 Claims, 27 Drawing Sheets

(56) References Cited

U.S. PATENT DOCUMENTS

| | | | |
|---|---|---|---|
| 2012/0299150 A1* | 11/2012 | Tang | ........................ H01L 23/36 |
| | | | 257/531 |
| 2016/0086723 A1 | 3/2016 | Su et al. | |
| 2016/0111787 A1 | 4/2016 | Palm et al. | |
| 2017/0222563 A1 | 8/2017 | Noma et al. | |

* cited by examiner

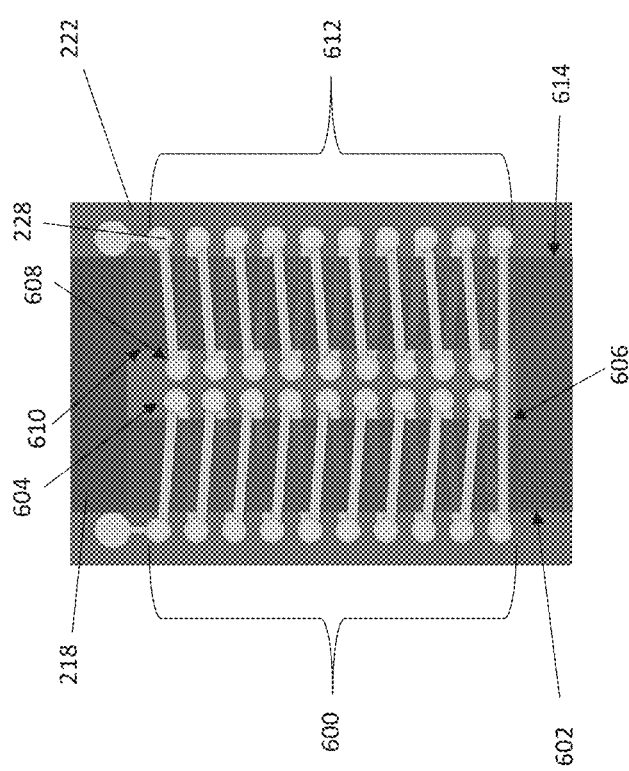
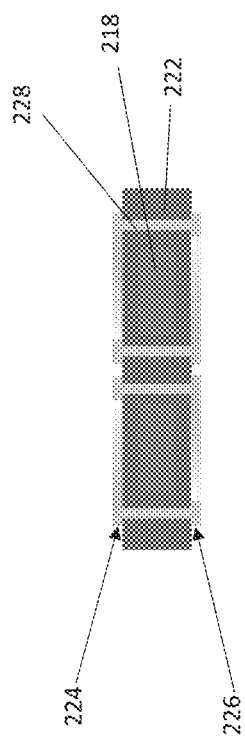
Figure 6A
Figure 6B

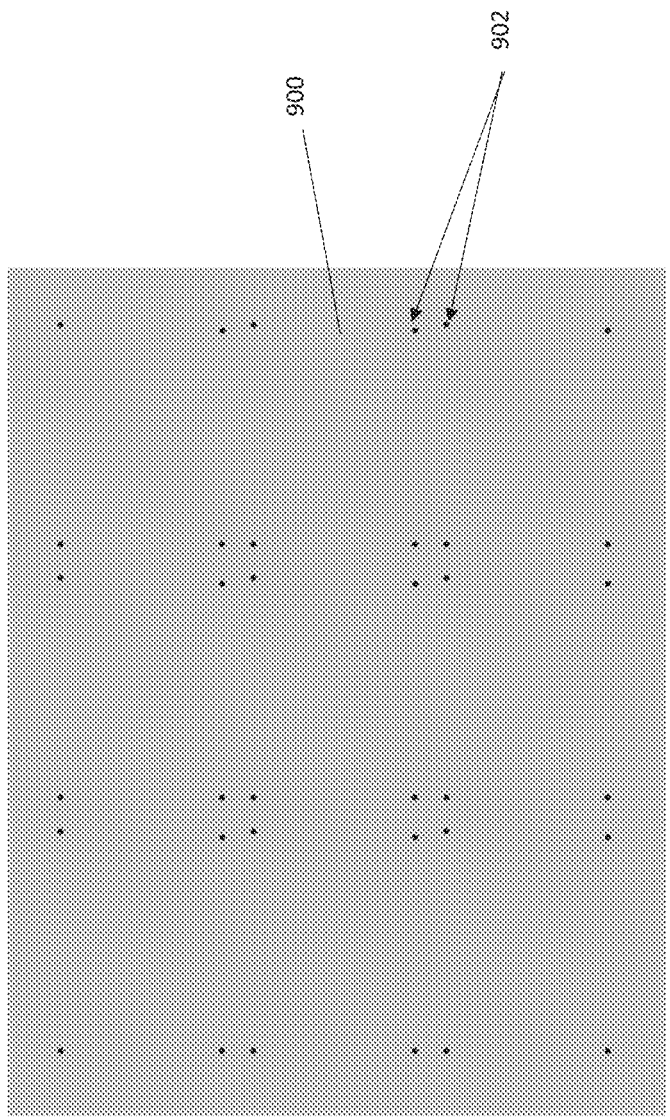
Figure 11A
Figure 10A

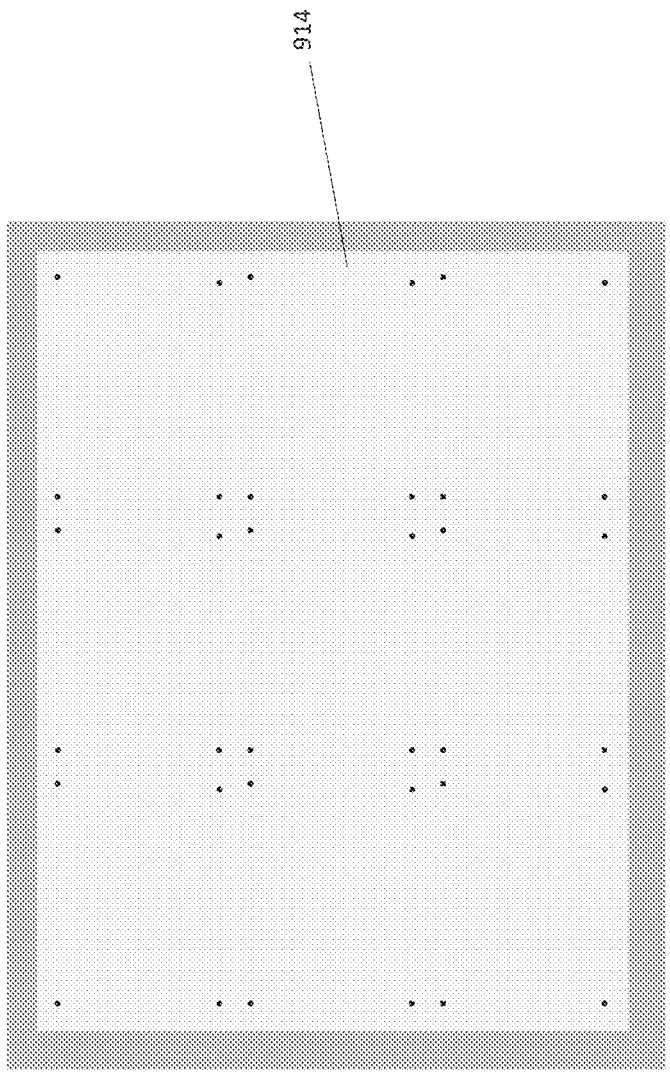
Figure 11E
Figure 10E

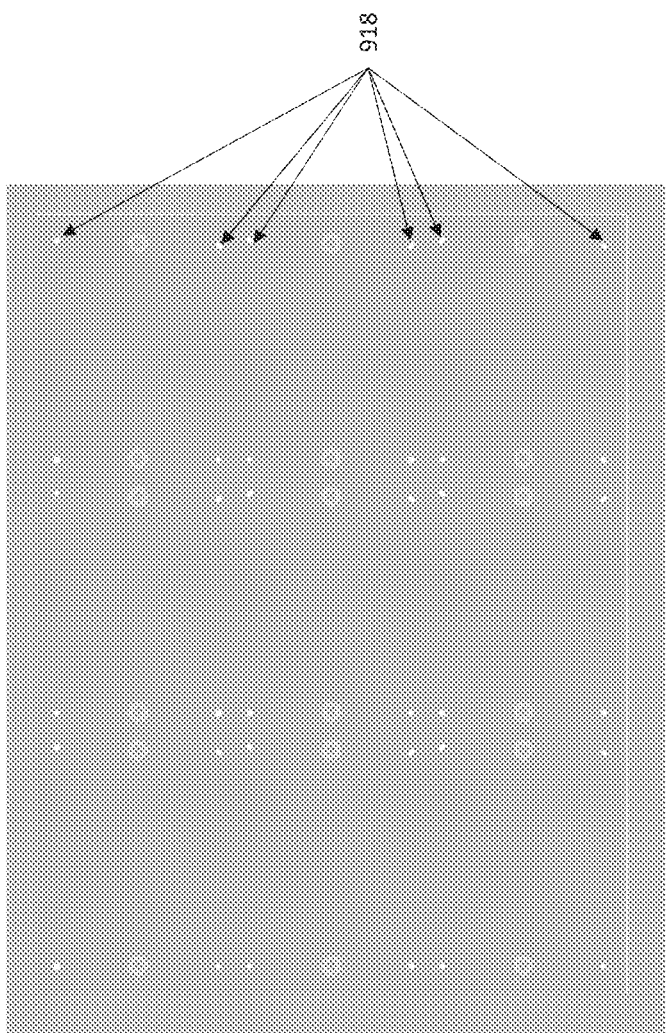
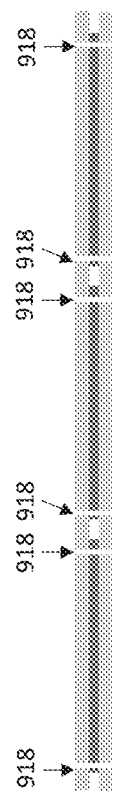
Figure 11H
Figure 10H

US 10,601,314 B2

POWER SEMICONDUCTOR SYSTEMS HAVING INDUCTOR MODULES, AND METHODS OF MANUFACTURING INDUCTOR MODULES AND POWER SEMICONDUCTOR SYSTEMS HAVING INDUCTOR MODULES

TECHNICAL FIELD

The present application relates to inductor modules for power semiconductor systems, in particular an inductor module for attachment to a power stage module of a power semiconductor system.

BACKGROUND

DC-DC voltage regulator systems such as buck converters include an arrangement of two power transistors, a gate driver IC and an inductor to convert voltage down for a load. Losses in a real system are generated at the connection path in the power system. To minimize these parasitic losses, the power transistors and the gate driver IC are usually assembled together in a single power module while the inductor is assembled aside on the main PCB (printed circuit board). Losses depend on the distance and cross-section of the connection line between the transistor output (switch node) and the inductor terminals, hence a more ideal solution which positions the inductor closer to the power module is needed.

SUMMARY

According to an embodiment of a power semiconductor system, the power semiconductor system comprises a power stage module comprising one or more power transistor dies attached to or embedded in a first printed circuit board, and an inductor module attached to the power stage module and comprising an inductor electrically connected to an output node of the power stage module, the inductor being formed from a ferrite sheet embedded in a second printed circuit board and windings patterned into the second printed circuit board.

According to an embodiment of a method of manufacturing the power semiconductor system, the method comprises: providing a power stage module comprising one or more power transistor dies attached to or embedded in a first printed circuit board; and attaching an inductor module to the power stage module, the inductor module comprising an inductor electrically connected to an output node of the power stage module, the inductor being formed from a ferrite sheet embedded in a second printed circuit board and windings patterned into the second printed circuit board.

According to an embodiment of a method of manufacturing the inductor module, the method comprising: embedding a ferrite sheet in an insulating material, the ferrite sheet having a plurality of elongated openings; laminating first and second metal sheets onto the insulating material over opposite sides of the ferrite sheet to form a panel; forming holes through the first and the second metal sheets and the insulating material, the holes being aligned with the elongated openings in the ferrite sheet; plating the holes with metal to form electrically conductive vias that extend between the first and the second metal sheets; patterning the first and the second metal sheets to form metal traces which are electrically connected by the vias to form a plurality of individual inductors; and dividing the panel into separate printed circuit boards, each printed circuit board including one or more of the individual inductors.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6A illustrates a top-down plan view of yet another embodiment of an inductor module, and FIG. 6B illustrates a corresponding sectional view of the inductor module.

FIGS. 10A through 10H illustrate sectional views of another embodiment of manufacturing the inductor modules shown in FIGS. 1 through 6B, and FIGS. 11A through 11H illustrate corresponding top-down plan views.

DETAILED DESCRIPTION

The embodiments described herein provide embedded PCB inductor modules manufactured using standard PCB processes with PCB materials and ferrite sheets. The inductor modules can be mounted on top of power stage modules of a DC-DC converter, using standard soldering or lamination and via drilling processes. The size and shape of the inductor modules can be optimized to match the power stage module to which the inductor module is to be attached. With such an inductor module, overall system cost and size is reduced while allowing for the manufacture of a customized (size, shape, inductance/resistance value, etc.) inductor module for various applications.

The inductor modules include an embedded ferrite sheet and metal wiring on both sides of the module connected together by plated through holes. The inductor module can be integrated into a power stage or other module with embedded die(s) using soldering or lamination processes. The ferrite sheet is used as an inductor core layer in a standard PCB board. The ferrite sheet is embedded in a standard PCB insulating material such as FR4, prepreg (sheets of glass cloth pre-impregnated with uncured epoxy resin), resin sheets, epoxy, etc., and metal sheets are laminated onto the insulating material using standard PCB processes. The inductor wiring is implemented by traces pattered into the metal sheets on the top and bottom sides of the inductor module that are connected together by plated through holes. The ferrite sheet can include elongated openings for the plated through holes. The cross-section area through which the flux passes can be made very wide. Due to the absence of an air gap, the flux is confined in the magnetic core (ferrite sheet), which reduces fringing effects and lowers EMI (electromagnetic interference), and depending on the properties of the ferrite sheet, allows the core to saturate easier at high current.

Figure 1:
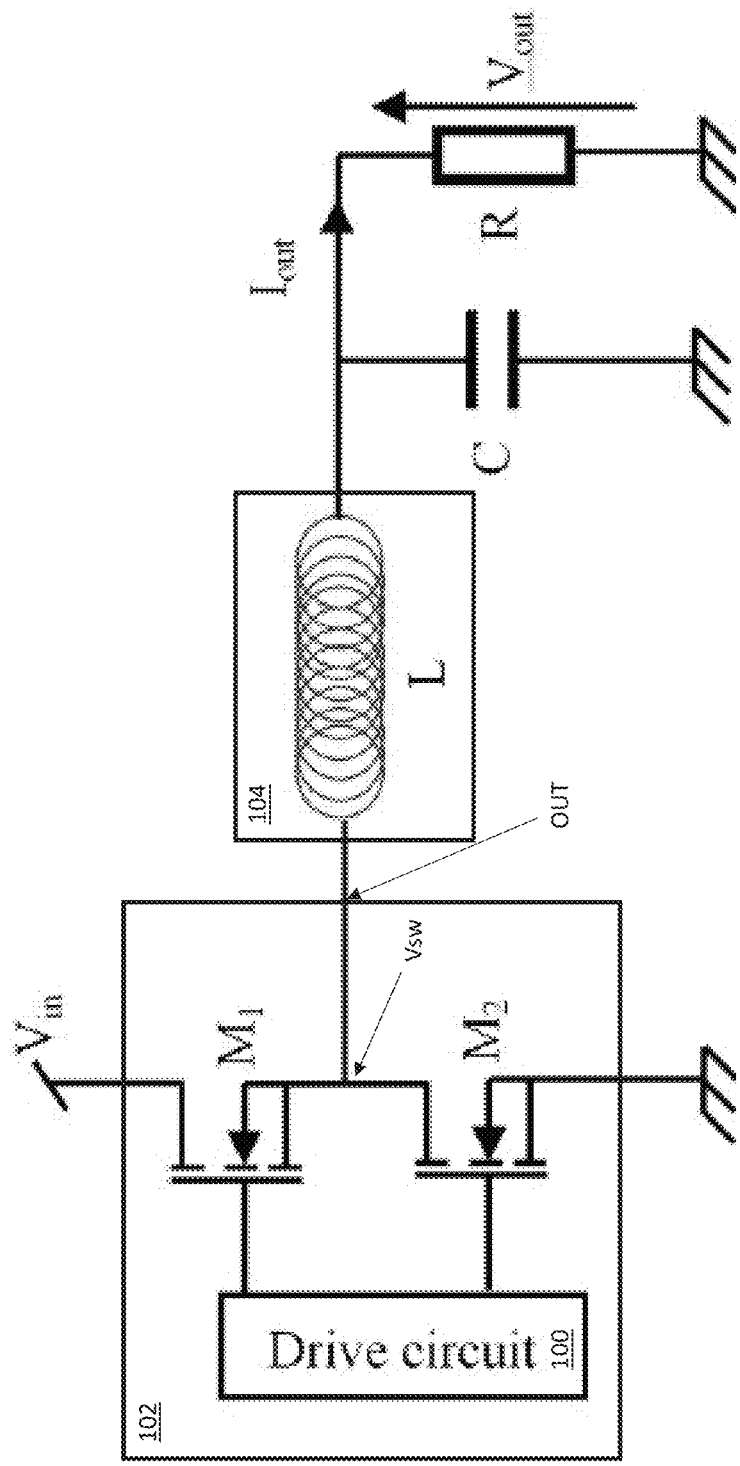
FIG. 1 illustrates a schematic view of an embodiment of a power semiconductor system that includes an inductor module attached to a power stage module.

FIG. 1 illustrates an embodiment of a DC-DC voltage regulator system of the buck converter type. The buck converter system includes high-side and low-side power transistors M1, M2 such as power MOSFETs (metal-oxide-semiconductor field effect transistors), IGBTs (insulated gate bipolar transistors), HEMTs (high electron mobility transistors), etc., a gate driver IC (integrated circuit) 100, and an inductor L and capacitor C to convert an input voltage Vin down to Vout for a load which is represented by resistor R. The high-side power transistor M1 and the low-side power transistor M2 are coupled at a switching node Vsw. The inductor L is coupled to the switching node Vsw, and the capacitor C is coupled to the inductor L for reducing voltage ripple at the regulator output Vout. Losses in such a system are generated at the connection paths in the power system, e.g. between the switch node Vsw of the converter and the output inductor L. To minimize parasitic losses, the power transistors M1, M2 and the gate driver IC 100 are assembled together in a single package 102, also referred to herein as a power stage module. The inductor L is assembled in a separate module 104 using standard PCB processes, and attached to the output OUT of the power stage module 102 e.g. by soldering or lamination. The output OUT of the power stage module 102 is electrically connected internally to the switch node Vsw. In one embodiment, the inductor L of the inductor module 104 attached to the power stage module 102 has an inductance in a range of 400 nH to 550 nH, a resistance less than 100 milliohm and a saturation current of about 8 A or greater. In general, the inductors are well-suited for power applications and designed for high-current such as 1 or more amperes. For high-power applications, the inductance is at least 300 nH or greater to avoid saturation.

Figure 2:
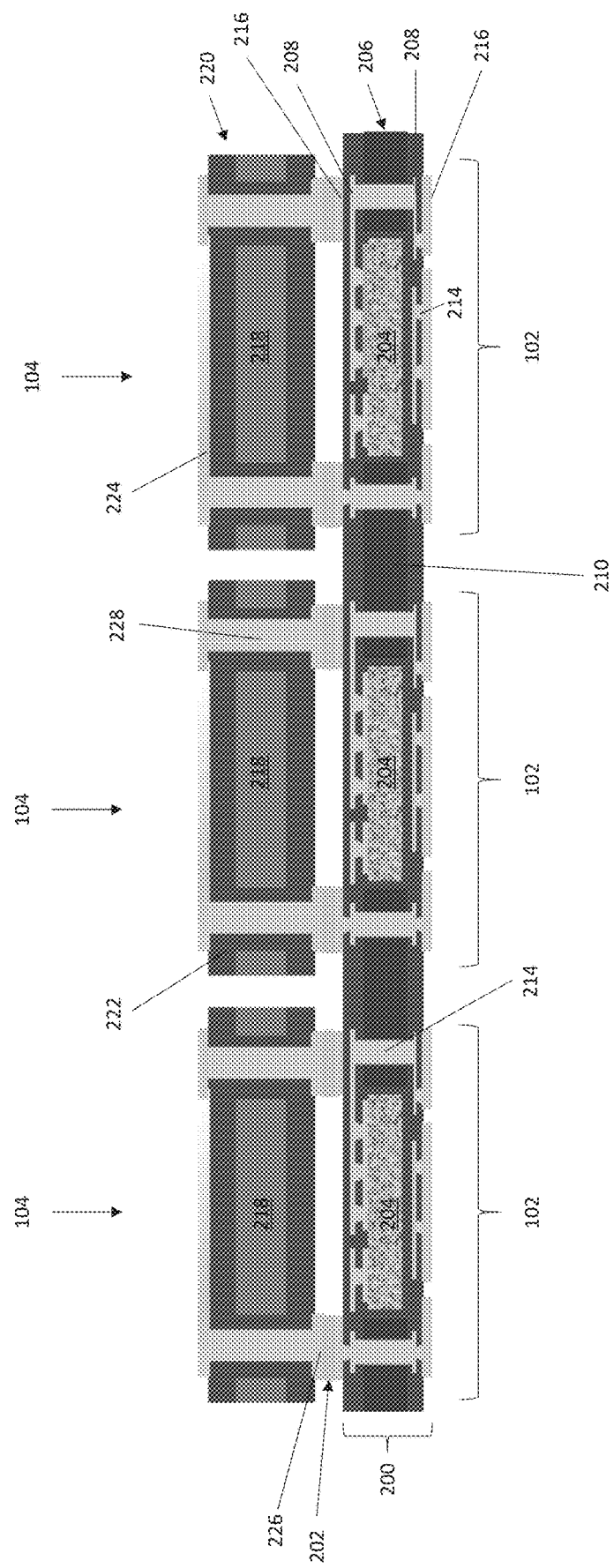
FIG. 2 illustrates a sectional view of an embodiment of a plurality of individual inductor modules soldered to a PCB panel of power stage modules.

FIG. 2 illustrates an embodiment of attaching separate inductor modules 102 to a PCB panel 200 of power stage modules 102 to form power semiconductor systems. According to this embodiment, there are multiple power stage modules 102 in the PCB panel 200 and the power stage modules 102 have yet to be singulated at the time of inductor module attachment. The individual inductor modules 104, having already been manufactured and singulated, are soldered to respective ones of the power stage modules 102. Any standard soldering process can be used to form solder joints 202 between the power stage modules 102 and the respective inductor modules 102.

Both the power stage modules 102 and the separate inductor modules 104 are formed using standard PCB processing according to the embodiment shown in FIG. 2. Each power stage module 102 includes one or more power transistor dies 204 attached to or embedded in a first PCB 206. The first PCB 206 includes one or more patterned metal sheets 208 laminated on standard PCB insulating material 210 such as FR4, prepreg, resin sheets, epoxy, etc. Conductive vias 212 form electrical connections between the patterned metal sheets 208 and between a patterned metal sheet 208 and the die(s) 204 included in the respective power stage modules 102. Contact pads 216 can be patterned into the topmost and bottommost metal sheets of the power stage modules 102, to provide electrical and/or thermal pathways to each power stage module 102. Some of the top-side contact pads 216 of the power stage modules 102 in FIG. 2 form the output node OUT shown in FIG. 1.

Each inductor module 104 comprises an inductor electrically connected to the output node of the power stage module 102 to which that inductor module 104 is soldered. The inductor is formed from a ferrite sheet 218 embedded in a second PCB board 220 and windings patterned into the second PCB 220. The second PCB 220 includes a standard PCB insulating material 222 such as FR4, prepreg, resin sheets, epoxy, etc. in which the ferrite sheet 218 is embedded. First and second metal sheets 224, 226 are laminated onto the insulating material 222 over opposite sides of the ferrite sheet 218 using standard PCB processing. The inductor windings are formed by metal traces patterned into the metal sheets 224, 226, and a plurality of electrically conductive vias 228 which extend between the metal sheets 224, 226 and connect the metal traces to form one or more coils. After soldering of the inductor modules 104 to the respective power stage modules 102 of the PCB panel 200, individual power semiconductor systems can be realized by singulating the PCB panel 200 e.g. by sawing, dicing, etc.

Figure 3A:
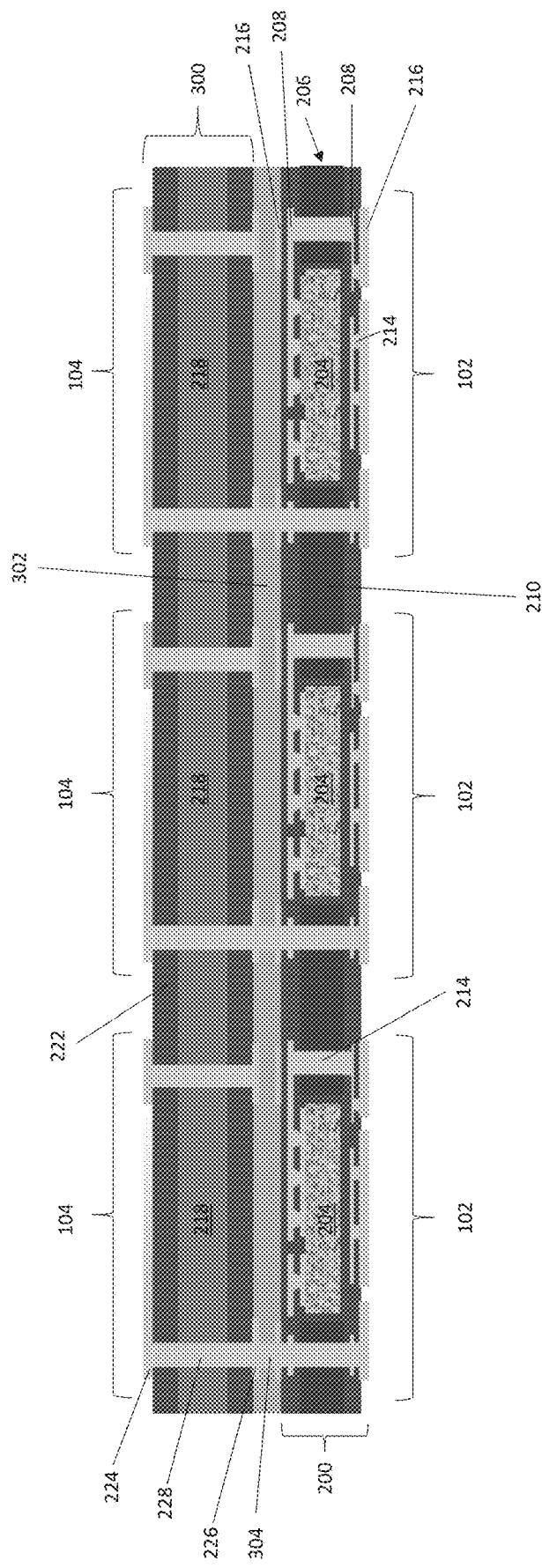
FIG. 3A illustrates a sectional view of an embodiment of a PCB panel of inductor modules laminated onto a PCB panel of power stage modules.

FIG. 3A illustrates another embodiment of attaching inductor modules 104 to power stage modules 102 to form power semiconductor systems. The embodiment shown in FIG. 3A is similar to the embodiment shown in FIG. 2. Different, however, the inductor modules 104 are laminated onto the respective power stage modules 102. According to this embodiment, both the power stage modules 102 and the inductor modules 104 are still arranged as part of different PCB panels 200, 300 at the time of attachment. That is, neither the inductor modules 104 nor the power stage modules 102 are singulated prior to attachment. Standard PCB processing is employed to form an additional insulating material 302 such as FR4, prepreg, resin sheets, epoxy, etc. between the power stage PCB panel 200 and the inductor PCB panel 300. Electrically conductive vias 304 are formed in the additional PCB insulating material 302 to electrically connect the inductors of the inductor modules 104 to the respective output nodes of the power stage modules 102. After lamination of the inductor PCB panel 300 to the power stage PCB panel 200, individual power semiconductor systems can be realized by singulation, e.g. by sawing, dicing, etc.

Figure 3B:
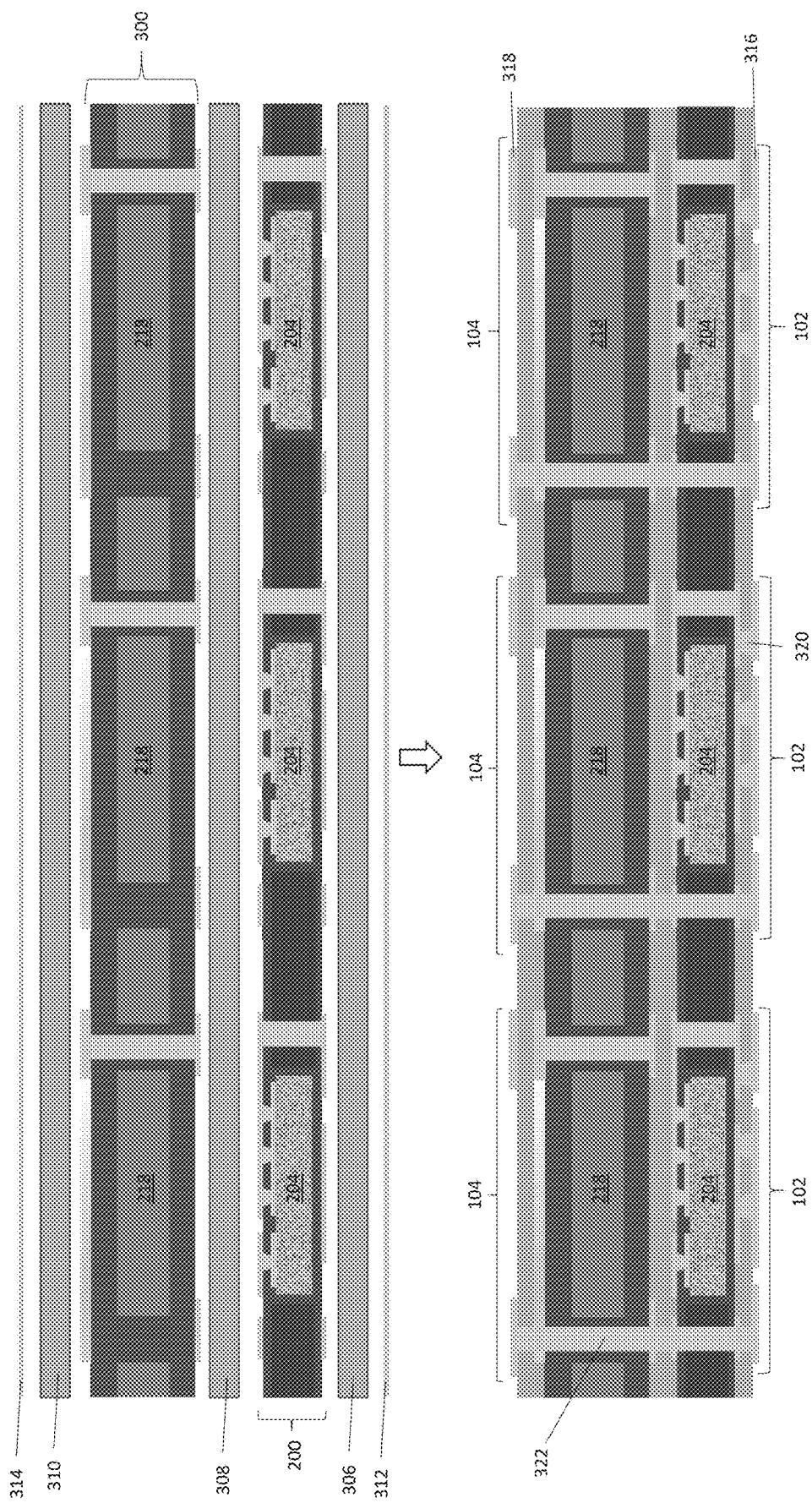
FIG. 3B illustrates a sectional view of another embodiment of a PCB panel of inductor modules laminated onto a PCB panel of power stage modules.

FIG. 3B illustrates another embodiment of attaching the inductor modules 104 to the power stage modules 102 by a lamination process to form power semiconductor systems. According to this embodiment, the inductor PCB panel 300 is laminated to the power stage PCB panel 200 by aligning the panels 200, 300 with additional PCB insulating materials 306, 308, 310 and metal sheets 312, 314. The stack is then laminated using any standard PCB process. Part of the PCB process involves forming holes in the laminated stack, plating the holes and patterning the top and bottom metal sheets 312, 314 to form top and bottom contact pads 316, 318, via connections 320 to the bottom contact pads 318, and through via connections 322 to electrically connect the respective inductor modules 104 to the corresponding power stage modules 102. After lamination of the inductor PCB panel 300 to the power stage PCB panel 200, individual power semiconductor systems can be realized by singulation, e.g. by sawing, dicing, etc.

Various embodiments of inductor module structures and methods of manufacture are described next.

Figure 4A:
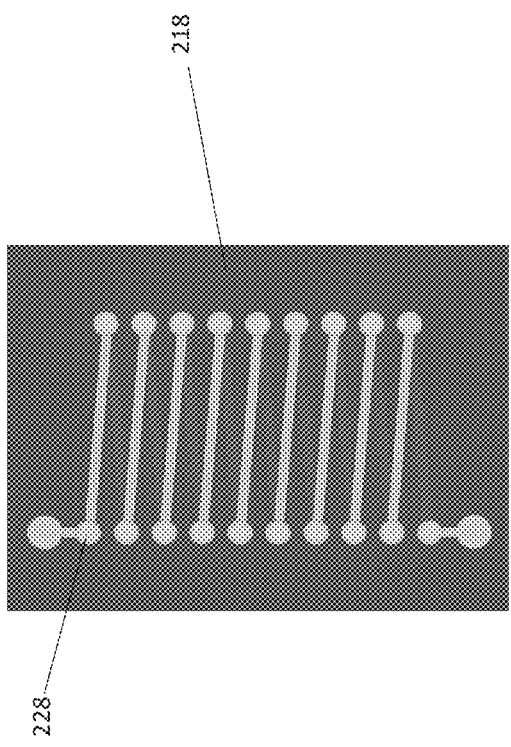
FIG. 4A illustrates a top-down plan view of an embodiment of an inductor module.
Figure 4B:
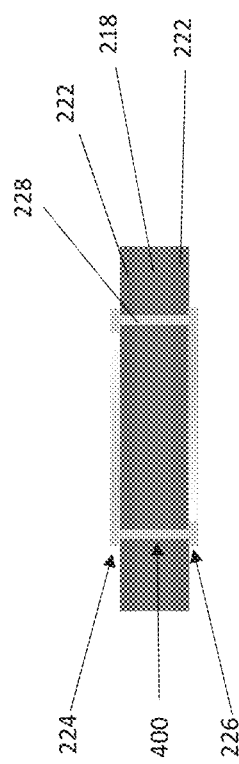
FIG. 4B illustrates a corresponding sectional view of the inductor module.

FIG. 4A shows a top-down plan view of an embodiment of an inductor module, and FIG. 4B shows a corresponding sectional view. FIG. 4A shows the inductor module with the ferrite sheet 218 exposed, so that the relationship between the electrically conductive vias 228 and the ferrite sheet 218 is visible in the top-down plan view. According to this embodiment, each individual one of the plurality of electrically conductive vias 228 is disposed in a different through hole 400 formed in the ferrite sheet 218. The through holes 400 can be formed by laser drilling, mechanical drilling, stamping, etc. of the ferrite sheet 218. Sidewalls of the through holes 400 formed in the ferrite sheet 218 can be covered by an electrically insulating material before the conductive vias 228 are formed, to electrically insulate the vias 228 from the ferrite sheet 218. If the ferrite sheet 218 is not electrically conductive or a poor electrical conductor, the sidewall insulation can be omitted and the vias 228 can be plated directly on the sidewalls of the through holes 400 formed in the ferrite sheet 218. In this case, the ferrite sheet 218 is selected so that the plated metal adheres sufficiently to the sidewalls of the through holes 400 to form the electrically conductive vias 228. The holes can have a different size and/or shape than shown e.g. the holes can be larger, have sloped or slanted sidewalls, can be small/round, etc.

Figure 5A:
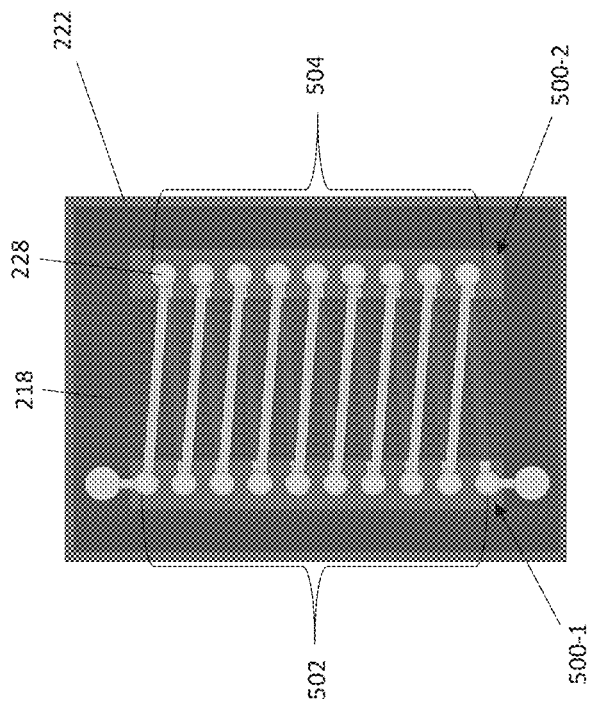
FIG. 5A illustrates a top-down plan view of another embodiment of an inductor module.
Figure 5B:
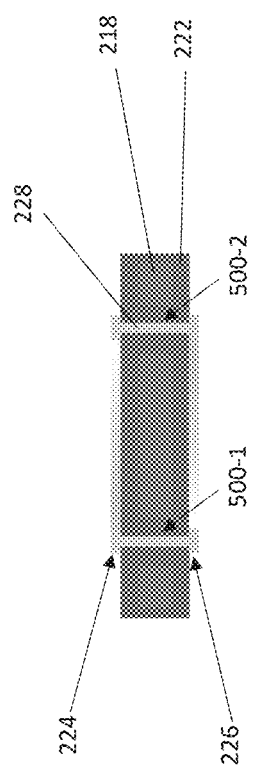
FIG. 5B illustrates a corresponding sectional view of the inductor module.

FIG. 5A shows a top-down plan view of another embodiment of an inductor module, and FIG. 5B shows a corresponding sectional view. FIG. 5A shows the inductor module with the ferrite sheet 218 exposed, so that the relationship between the electrically conductive vias 228 and the ferrite sheet 218 is visible in the top-down plan view. According to this embodiment, the ferrite sheet 218 is pre-formed with a plurality of elongated openings 500 prior to lamination. The elongated openings 500 can be formed by laser drilling, mechanical drilling, stamping, etc. of the ferrite sheet 218. The PCB insulating material 222 of the inductor module fills the elongated openings 500 during the lamination process. Holes are then formed through the PCB insulating material 222 and plated so that a first group 502 of the electrically conductive vias 228 passes through a first preformed elongated opening 500-1 in the ferrite sheet 218 and a second group 504 of the electrically conductive vias 228 passes through a second preformed elongated opening 500-2 in the ferrite sheet 218 to connect the metal traces on both sides of the module and form one or more coils of the inductor. The holes can have a different size and/or shape than shown e.g. the holes can be larger, have sloped or slanted sidewalls, can be small/round, etc.

FIG. 6A shows a top-down plan view of an inductor module, and FIG. 6B shows a corresponding sectional view. FIG. 6A shows the inductor module with the ferrite sheet 218 exposed, so that the relationship between the electrically conductive vias 228 and the ferrite sheet 218 is visible in the top-down plan view. According to this embodiment, the ferrite sheet 218 is patterned into an elongated toroid prior to lamination, e.g. by laser drilling, mechanical drilling, stamping, etc. The PCB insulating material 222 fills the space around the elongated toroid during the lamination process. Holes are then formed through the PCB insulating material 222 and plated so that a first group 600 of the electrically conductive vias 228 extends along a first outer elongated side 602 of the toroid, a second group 604 of the electrically conductive vias 228 extends along a first inner elongated side 606 of the toroid, a third group 608 of the electrically conductive vias 228 extends along a second inner elongated side 610 of the toroid and a fourth group 612 of the electrically conductive vias 228 extends along a second outer elongated side 614 of the toroid to connect the metal traces and form one or more coils of the inductor. The holes can have a different size and/or shape than shown e.g. the holes can be larger, have sloped or slanted sidewalls, can be small/round, etc.

In each of the embodiments illustrated in FIGS. 1 through 6B, the electrically conductive vias 228 that connect the metal traces to form the inductor coils are plated through holes formed using standard PCB processing. The through holes can be lined with an insulating material prior to plating, or be uncovered at the start of the plating process. Depending on the diameter of the through holes, just the sidewalls of the through holes may be plated with the inner part remaining open, or each individual through hole can be filled with metal to form the electrically conductive vias 228.

Figure 7:
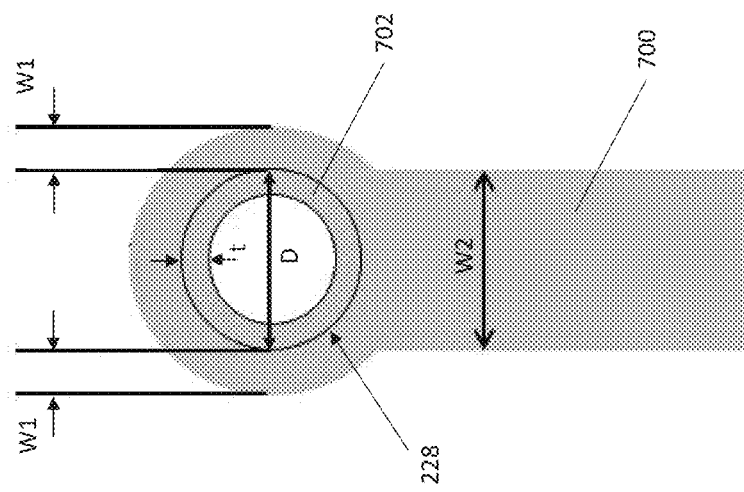
FIG. 7 illustrates a top-down plan view of an embodiment of an electronically conductive via and metal trace of an inductor module.

FIG. 7 illustrates an embodiment of one of the electrically conductive vias 228 connected to a metal trace 700 of the inductor module 104. According to this embodiment, the electrically conductive via 228 has a diameter D in a range of 80 micrometers to 300 micrometers, e.g. 100 micrometers to 200 micrometers, 150 micrometers to 200 micrometers, etc. The thickness t of the through hole sidewall plating 702 can range from 10 to 15 micrometers to 40 micrometers, for example. The width W1 of the metal trace 700 surrounding the electrically conductive via 228 can be in a range of 20 micrometers to 30 micrometers, for example. The width W2 of the metal trace 700 elsewhere can be in a range of 200 micrometers to 250 micrometers, for example. The dimensions of the metal traces 700 can be smaller or larger, and depend on the target inductance. The electrically conductive via 228 can include just the through hole sidewall plating 702, or can be filled entirely with metal.

FIGS. 8A through 8I illustrate sectional views of an embodiment of manufacturing the inductor modules 104 shown in FIGS. 1 through 6B. FIGS. 9A through 9I illustrate the corresponding top-down plan views.

Figure 8A:
FIGS. 8A through 8I illustrate sectional views of an embodiment of manufacturing the inductor modules shown in FIGS. 1 through 6B, and FIGS. 9A through 9I illustrate corresponding top-down plan views.
Figure 9A:
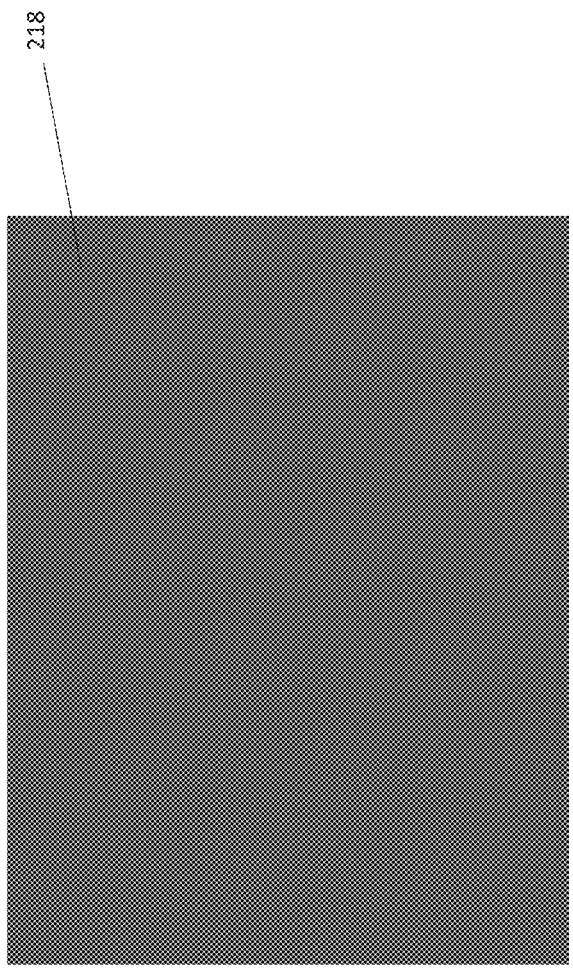

In FIGS. 8A and 9A, a ferrite sheet 218 is provided. The dimensions and composition (e.g. NiZn, NiZnCu, MnZn, etc.) of the ferrite sheet 218 can be selected as desired, and depend on the end application. For example, the ferrite sheet 218 can have a relative magnetic permeability in a range of 20 Mur to 500 Mur. At higher magnetic fields e.g. H of about 1e4, ferrite sheets with low relative magnetic permeability e.g. less than 100 Mur are well suited for high current applications. At lower magnetic fields e.g. H of about 1e3, ferrite sheets with high relative magnetic permeability e.g. above 200 Mur are well suited for low current applications. Thickness of the ferrite sheet 218 also effects the magnetic performance of the sheet 218.

Figure 8B:
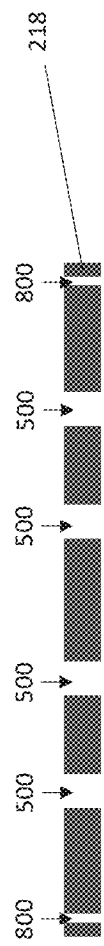
Figure 9B:
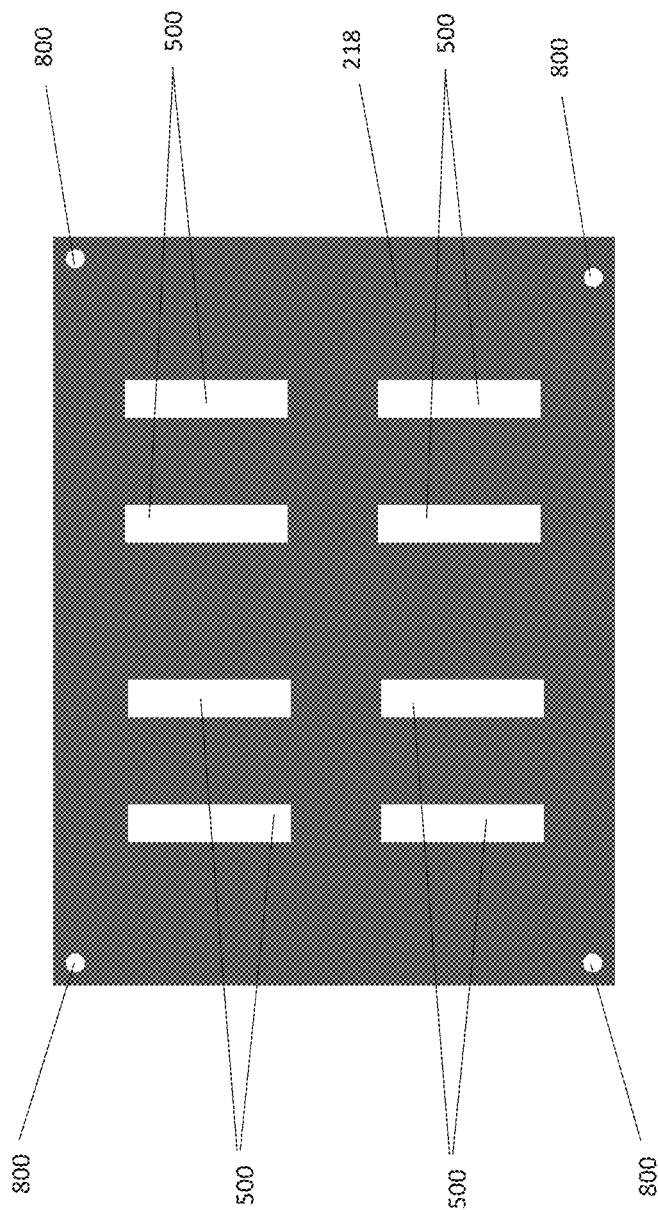

In FIGS. 8B and 9B, elongated openings 500 are formed in the ferrite sheet 218 by laser drilling, mechanical drilling, stamping, etc. Alignment holes 800 can also be formed in the ferrite sheet 218 at this step, to aid in the subsequent PCB lamination process.

Figure 8C:
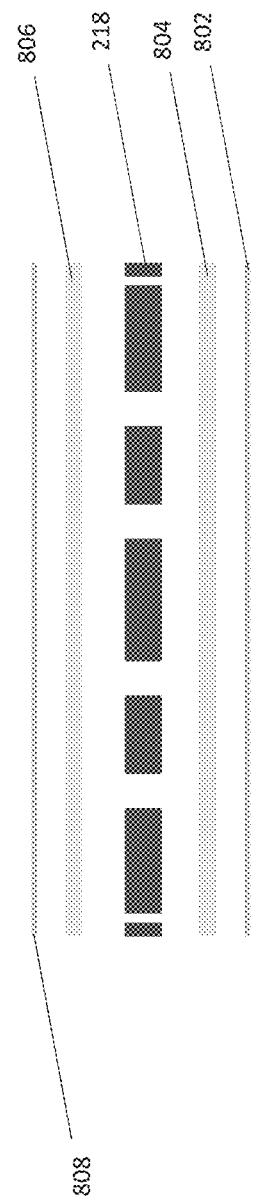
Figure 9C:
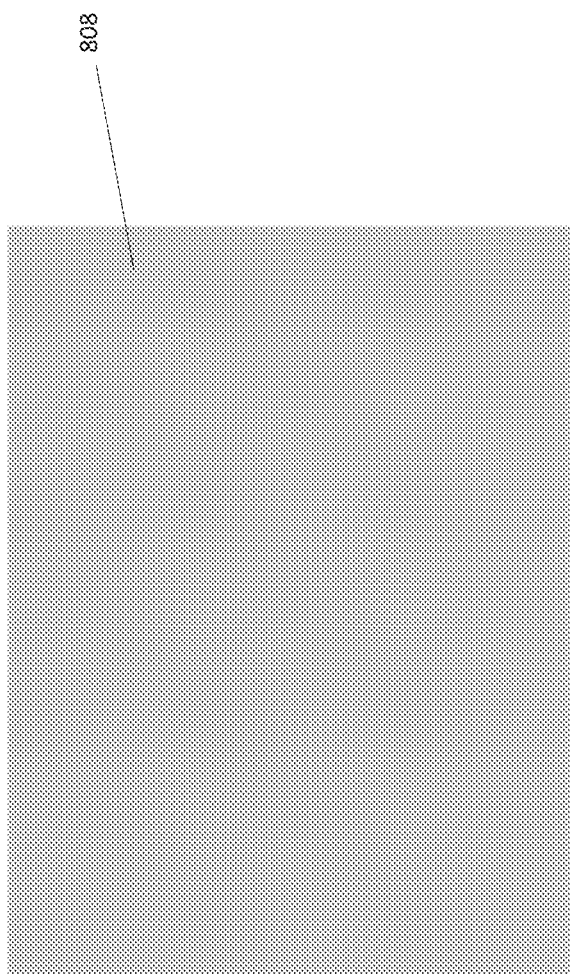

In FIGS. 8C and 9C, a copper sheet (foil) 802 and one or more sheets of PCB insulating material 804 such as prepreg are provided. The ferrite sheet 218 is then placed on the one or more sheets of PCB insulating material 804. One or more additional sheets of PCB insulating material 806 and another copper sheet (foil) 808 are then placed on the ferrite sheet 218.

Figure 8D:
Figure 9D:
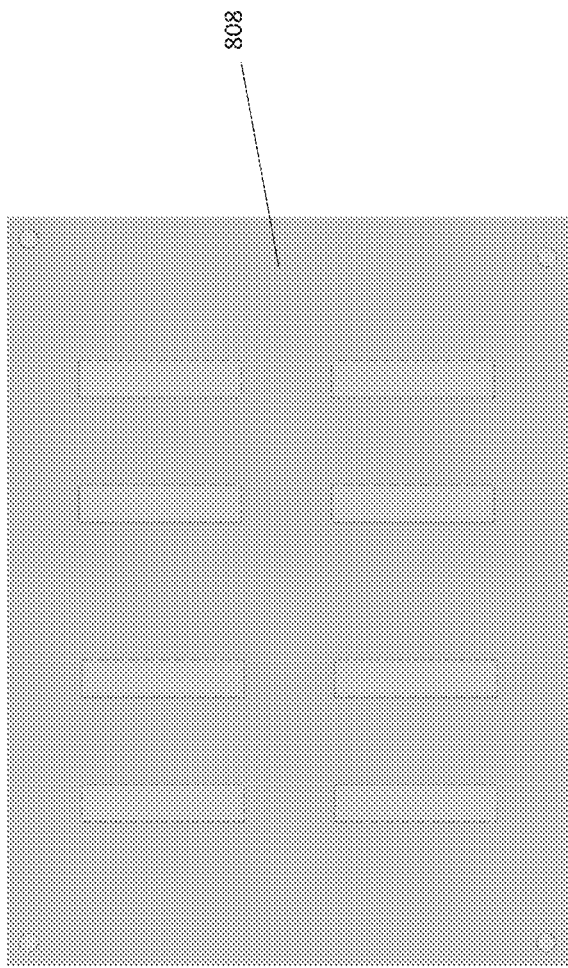

In FIGS. 8D and 9D, the stack of layers is pressed together and heated to bond the layers together. The heat melts and cures epoxy resin in the sheets of PCB insulating material 804, 806 while the pressure bonds the layers together. During this process, the ferrite sheet 218 with the preformed elongated openings 500 is embedded in the PCB insulating material 804, 806 and the lower and upper copper sheets 802, 808 are laminated onto the insulating material 804, 806 over opposite sides of the ferrite sheet 218 to form a PCB panel 810. The elongated openings 500 and alignment holes 800 in the ferrite sheet 218 are illustrated with dashed lines in FIG. 9D since the ferrite sheet 218 is out of view.

Figure 8E:
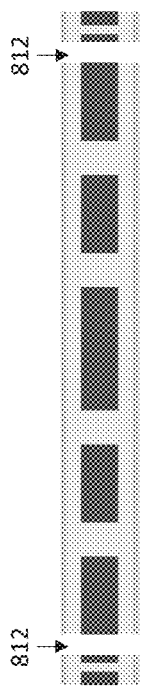
Figure 9E:
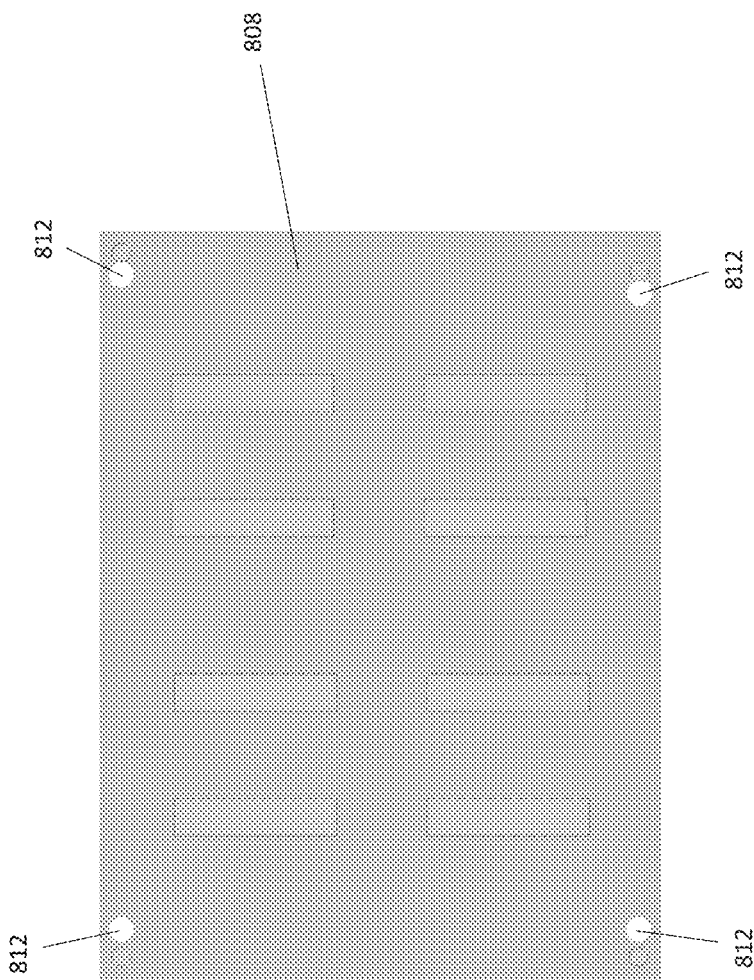

In FIGS. 8E and 9E, the preformed alignment holes 800 are located using e.g. X-ray imaging or by forming openings, and new alignment holes 812 are formed through the PCB panel 810 based on the location of the preformed alignment holes 800 in the ferrite sheet 218. The new alignment holes 812 are then used to align the subsequent through hole formation process. The new alignment holes 812 can be formed using any standard PCB through hole formation process such as laser or mechanical drilling.

Figure 8F:
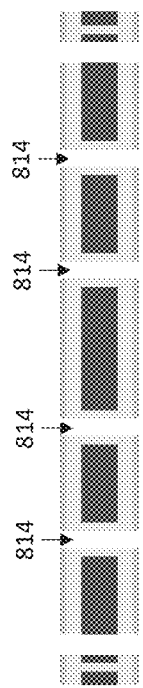
Figure 9F:
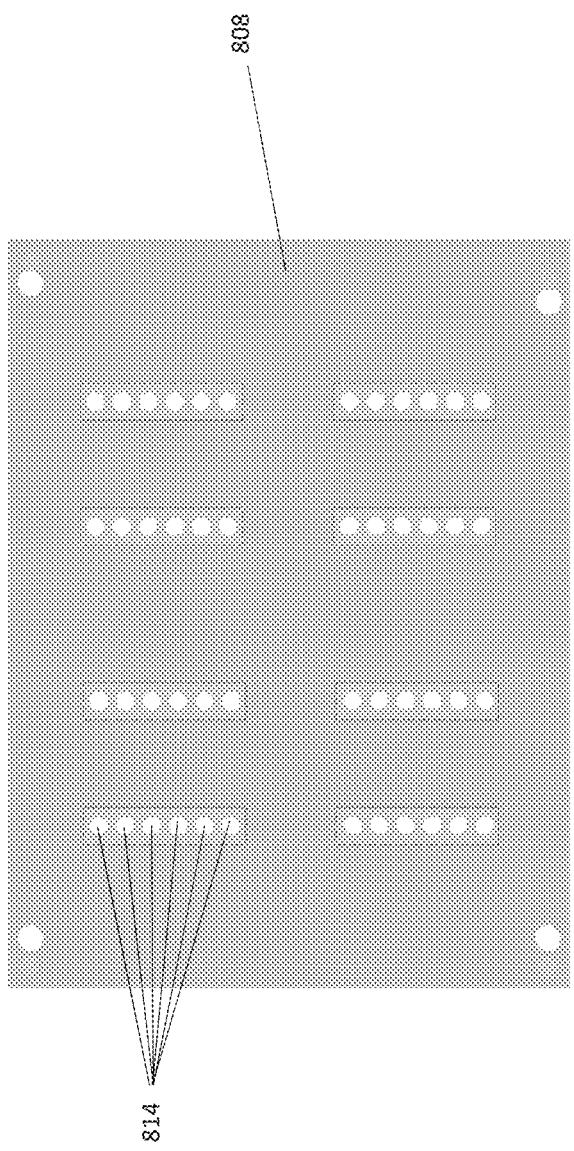

In FIGS. 8F and 9F, holes 814 are formed through the upper and lower copper sheets 802, 808 and the PCB insulating material 804, 806. The alignment holes 812 formed in FIGS. 8E and 9E are used to align the through holes 814 with the preformed elongated openings 800 in the ferrite sheet 218. The through holes 814 can be formed using any standard PCB through hole formation process such as laser or mechanical drilling.

Figure 8G:
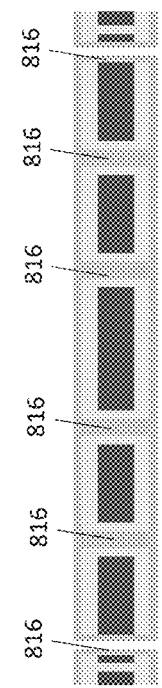
Figure 9G:
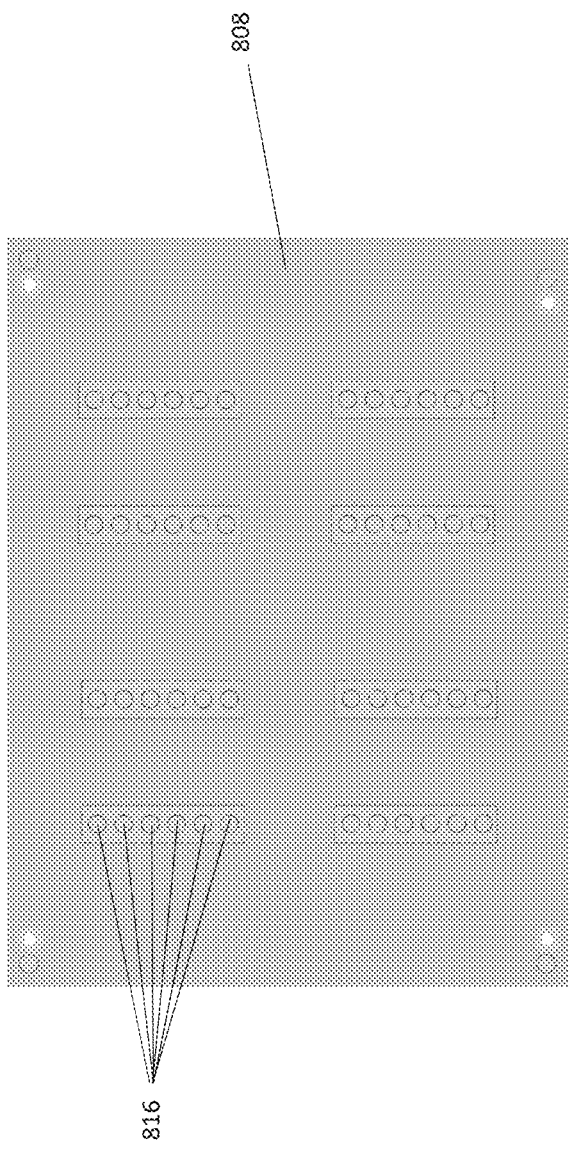

In FIGS. 8G and 9G, the through holes 814 are plated with metal 816. Any standard PCB through hole plating process such as electroless deposition, electroplating, direct metallization, etc. can be used to plate the through holes 814 with metal 816. As explained above, depending on the diameter of the through holes 814, only sidewalls of the through holes 814 may be plated or the through holes 814 may be completely filled e.g. with Cu. The plated holes form electrically conductive vias that extend between the upper and lower copper sheets 802, 808.

Figure 8H:
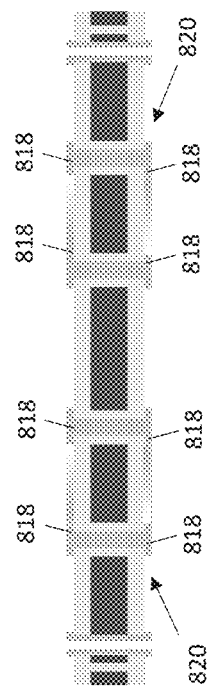
Figure 9H:
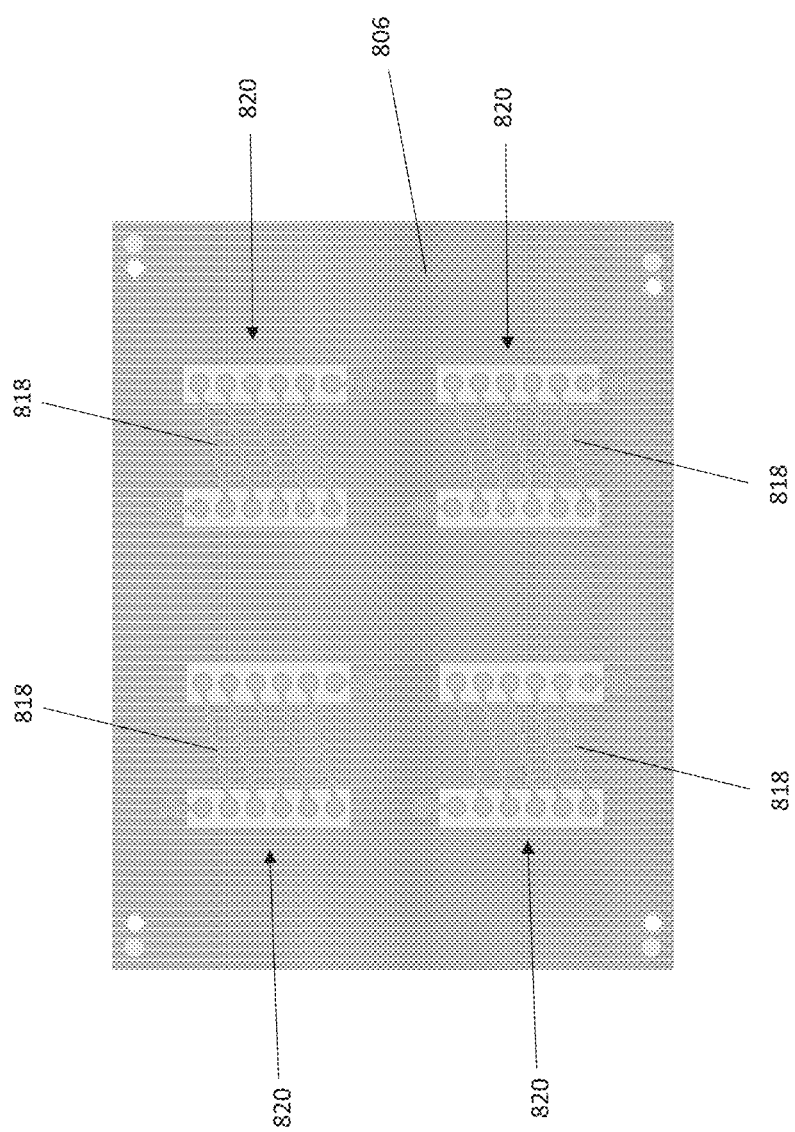

In FIGS. 8H and 9H, the upper and lower copper sheets 802, 808 are patterned to form metal traces 818 which are electrically connected by the vias 814/816 to form a plurality of individual inductors 820. Any standard PCB process for structuring the upper and lower copper sheets 802, 808 can be used such as photolithography and etching, silk screen printing, photoengraving, PCB milling, laser resist ablation, etc.

Figure 8I:
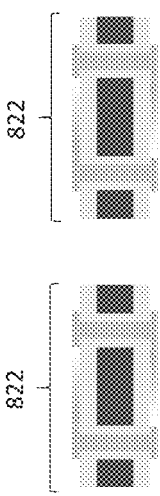
Figure 9I:
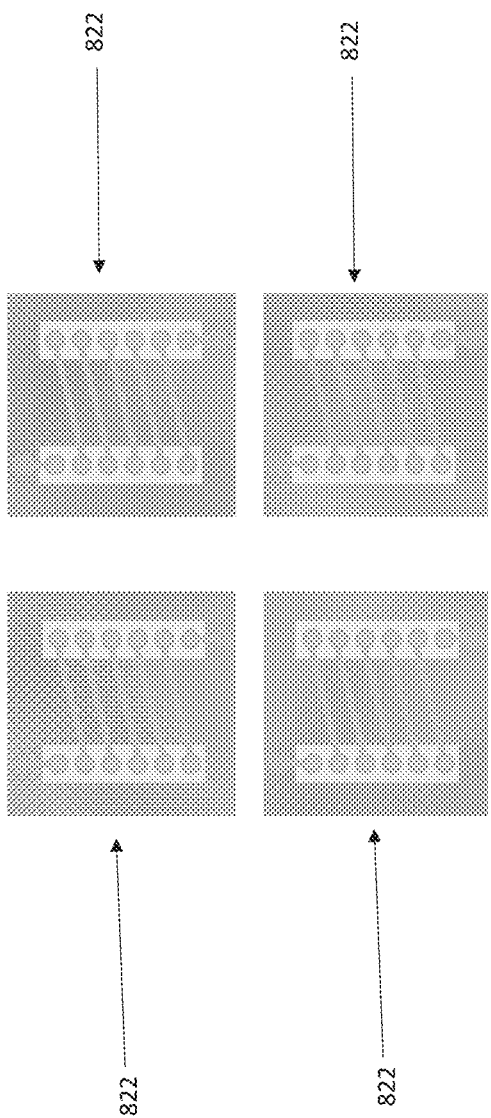

In FIGS. 8I and 9I, the PCB panel 810 is divided into separate PCBs 822. Each PCB 822 includes one or more of the individual inductors 820 previously formed in the PCB panel 810. Any standard PCB panel singulation process can be used such as drilling or routing perforations along the boundaries of the individual modules, or cutting V-shaped grooves across the full dimension of the PCB panel 810 to form lines of weakness and breaking the panel 810 apart along these lines, laser cutting the PCB panel, mechanical sawing/dicing, etc.

FIGS. 10A through 10H illustrate sectional views of another embodiment of manufacturing the inductor modules shown in FIGS. 1 through 5B. FIGS. 11A through 11H illustrate the corresponding top-down plan views.

In FIGS. 10A and 11A, a panel jig 900 with a plurality of alignment pins 902 is provided.

Figure 11B:
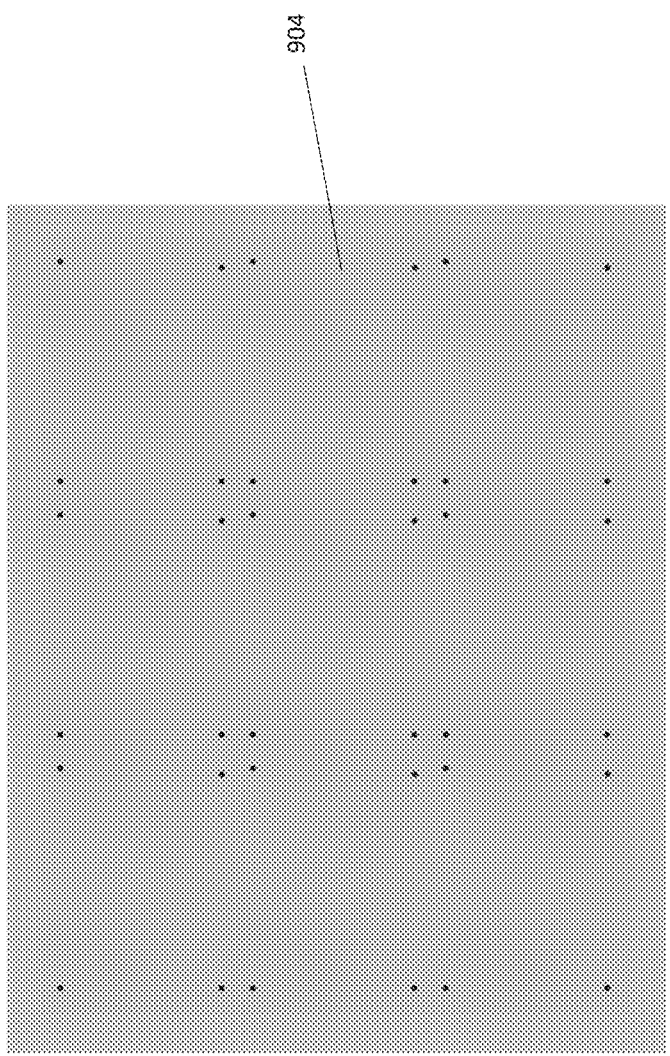
Figure 10B:

In FIGS. 10B and 11B, a copper sheet 904 is placed on the panel jig 900. The alignment pins 902 of the panel jig 900 penetrate through the copper sheet 904.

Figure 11C:
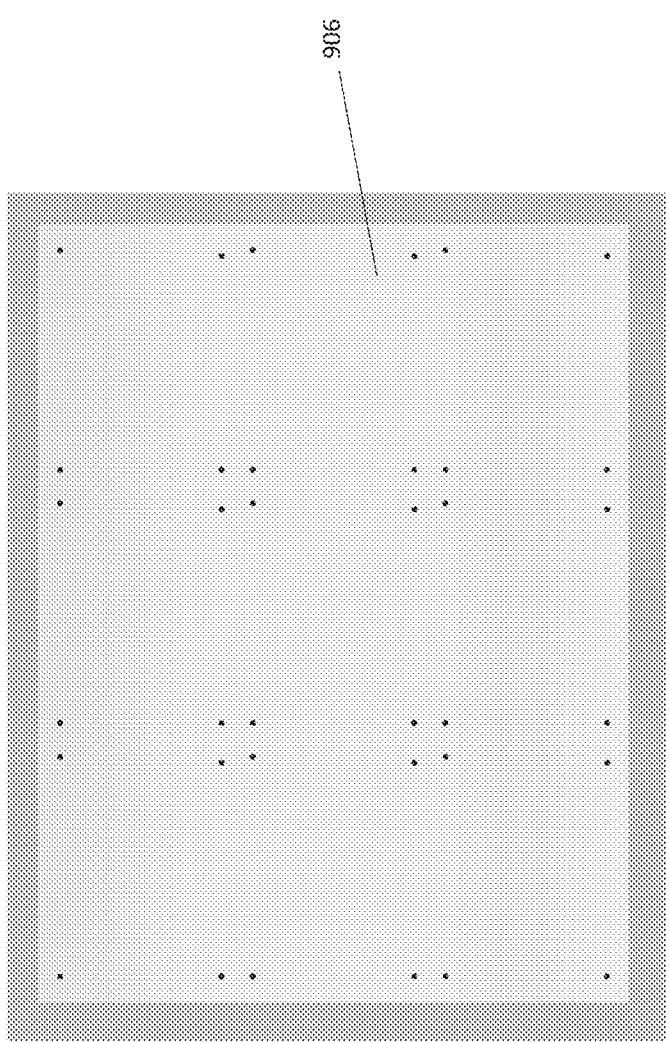
Figure 10C:
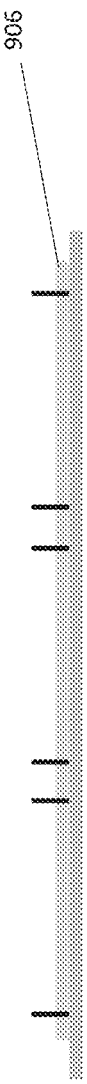

In FIGS. 10C and 11C, one or more sheets of PCB insulating material 906 such as prepreg are placed on the copper sheet 904. The alignment pins 902 of the panel jig 900 penetrate through each sheet of PCB insulating material 906.

Figure 11D:
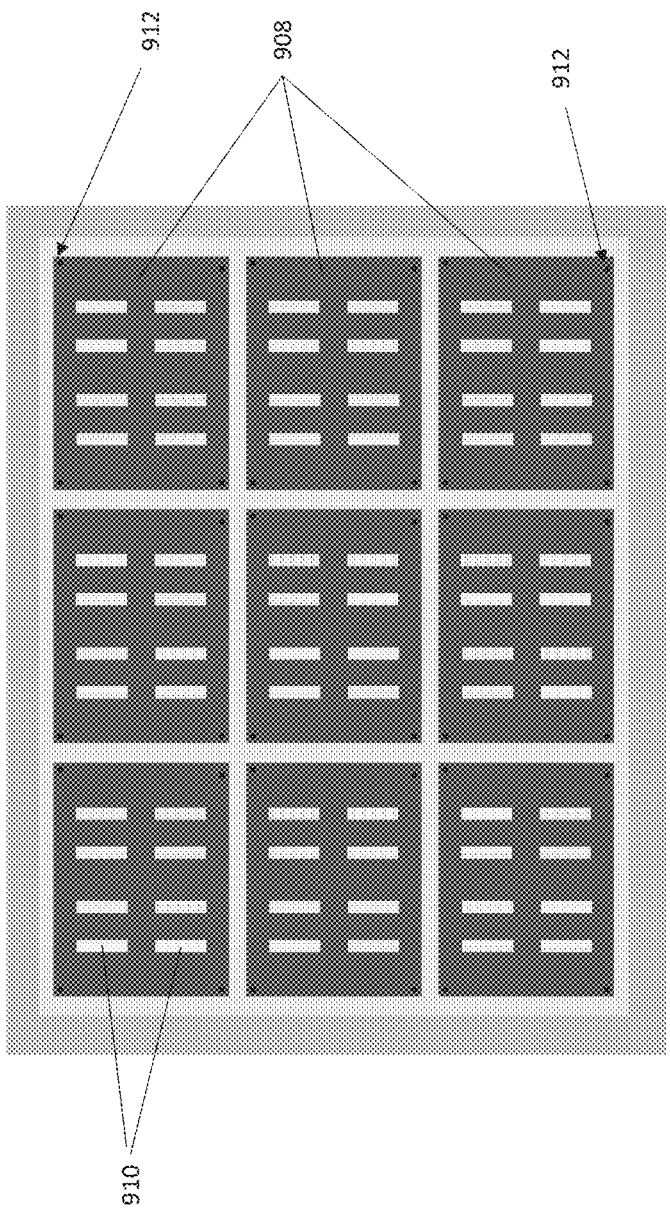
Figure 10D:
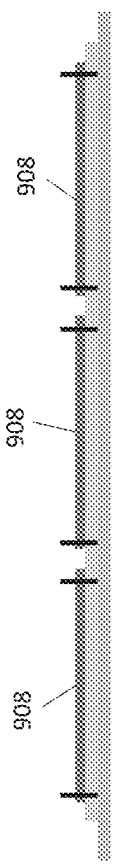

In FIGS. 10D and 11D, a plurality of separate ferrite sheets 908 are placed on the one or more sheets of PCB insulating material 906. The alignment pins 902 of the panel jig 900 are inserted into respective preformed alignment holes 910 of the separate ferrite sheets 908, to align the separate ferrite sheets 908 on the panel jig 900 prior to embedding the separate ferrite sheets 908 in PCB insulating material. Each separate ferrite sheet 908 also includes a plurality of elongated openings 912.

In FIGS. 10E and 11E, one or more additional sheets of PCB insulating material 914 such as prepreg are placed on the ferrite sheets 908. The alignment pins 902 of the panel jig 900 penetrate through each additional sheet of PCB insulating material 914.

Figure 11F:
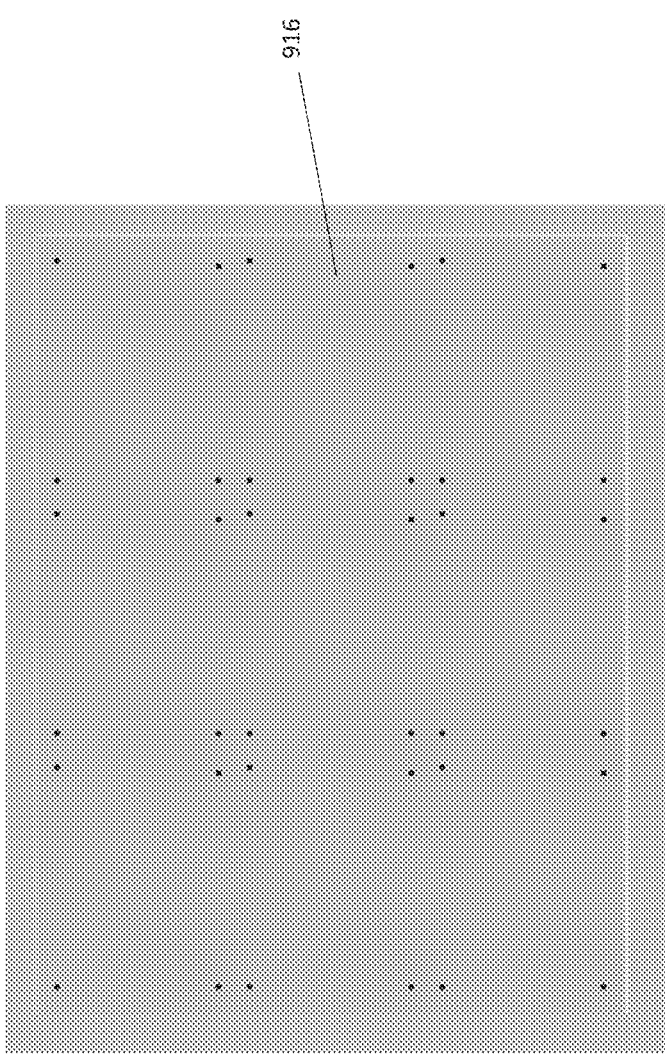
Figure 10F:

In FIGS. 10F and 11F, a copper sheet 916 is placed on the one or more additional sheets of PCB insulating material 914. The alignment pins 902 of the panel jig 900 penetrate through the top copper sheet 916.

Figure 11G:
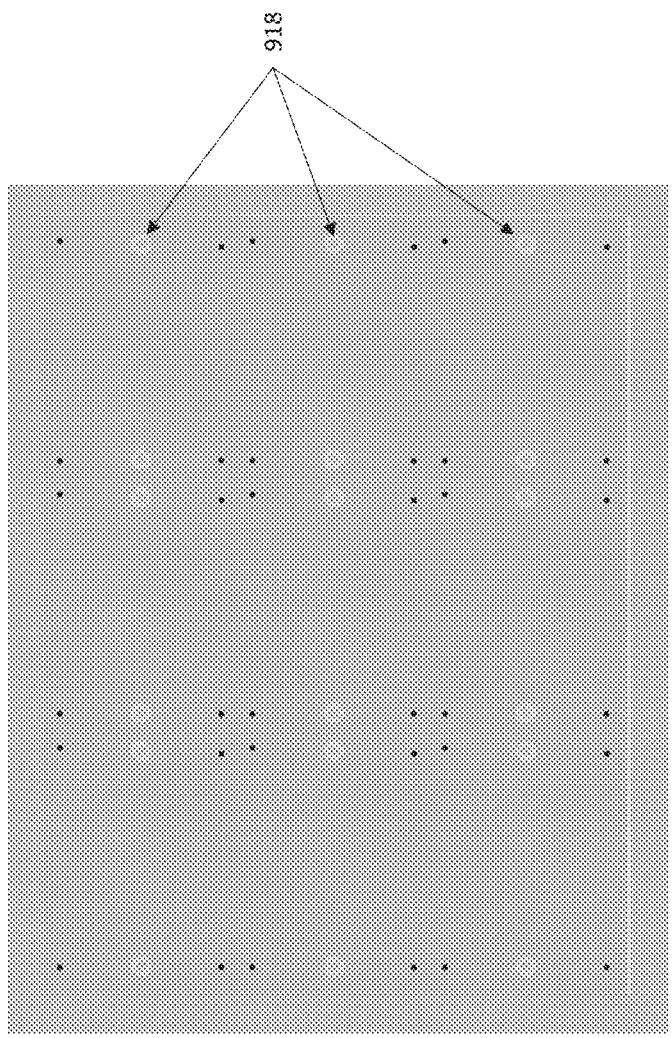
Figure 10G:

In FIGS. 10G and 11G, the PCB layers are point welded 918 to hold the layers in place during the subsequent lamination process.

In FIGS. 10H and 11H, the panel jig 900 is removed. Alternatively, the panel jig 900 can remain in place during the subsequent lamination process. Standard PCB panel lamination and singulation processes are then performed to yield individual inductor modules, e.g. as illustrated in FIGS. 8D through 9I and described above. The holes 920 in the PCB panel that result from removing the alignment pins 902 of the PCB jig 900 can be used to align through holes with the elongated openings 910 in the separate ferrite sheets 908. In another embodiment, X-ray imaging can be used to detect alignment marks preformed in the ferrite sheets 908. With this approach, exact alignment between the separate ferrite sheets 908 is not necessary. Instead, each ferrite sheet 908 can be aligned separately/individually.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor system, comprising:
   a power stage module comprising one or more power transistor dies attached to or embedded in a first printed circuit board; and
   an inductor module attached to the power stage module and comprising an inductor electrically connected to an output node of the power stage module, the inductor being formed from a ferrite sheet embedded in a second printed circuit board and windings patterned into the second printed circuit board.

2. The power semiconductor system of claim 1, wherein the inductor module is soldered to the power stage module.

3. The power semiconductor system of claim 1, wherein the inductor module is laminated onto the power stage module.

4. The power semiconductor system of claim 1, wherein the second printed circuit board comprises an insulating material in which the ferrite sheet is embedded, and first and second metal sheets laminated onto the insulating material over opposite sides of the ferrite sheet, and wherein the windings are formed by metal traces patterned into the first and the second metal metals, and a plurality of electrically conductive vias which extend between the first and the second metal sheets and connect the metal traces to form one or more coils.

5. The power semiconductor system of claim 4, wherein each individual one of the plurality of electrically conductive vias is disposed in a different through hole formed in the ferrite sheet.

6. The power semiconductor system of claim 5, wherein sidewalls of the through holes formed in the ferrite sheet are covered by an electrically insulating material.

7. The power semiconductor system of claim 4, wherein the plurality of electrically conductive vias is electrically insulated from the ferrite sheet.

8. The power semiconductor system of claim 4, wherein the ferrite sheet has a plurality of elongated openings, and wherein a first group of the plurality of electrically conductive vias passes through a first one of the elongated openings and a second group of the plurality of electrically conductive vias passes through a second one of the elongated openings to connect the metal traces and form the one or more coils.

9. The power semiconductor system of claim 4, wherein each individual one of the plurality of electrically conductive vias is filled with metal.

10. The power semiconductor system of claim 4, wherein the ferrite sheet is patterned into an elongated toroid, and wherein a first group of the plurality of electrically conductive vias extends along a first outer elongated side of the toroid, a second group of the plurality of electrically conductive vias extends along a first inner elongated side of the toroid, a third group of the plurality of electrically conductive vias extends along a second inner elongated side of the toroid and a fourth group of the plurality of electrically conductive vias extends along a second outer elongated side of the toroid to connect the metal traces and form the one or more coils.

11. The power semiconductor system of claim 4, wherein each individual one of the plurality of electrically conductive vias has a diameter in a range of 80 micrometers to 300 micrometers.

12. The power semiconductor system of claim 1, wherein the power stage module comprises a high-side power transistor and a low-side power transistor of a buck converter coupled at a switching node, and wherein the output node of the power stage module is electrically connected to the switching node.

13. The power semiconductor system of claim 12, wherein the inductor of the inductor module has an inductance of at least 300 nH.

* * * * *